United States Patent
Van Den Eijnden

(10) Patent No.: US 8,775,883 B2
(45) Date of Patent: Jul. 8, 2014

(54) METHOD OF AND AN ARRANGEMENT FOR AUTOMATICALLY MEASURING ELECTRIC CONNECTIONS OF ELECTRONIC CIRCUIT ARRANGEMENTS MOUNTED ON PRINTED CIRCUIT BOARDS

(75) Inventor: Petrus Marinus Cornelis Maria Van Den Eijnden, Eindhoven (NL)

(73) Assignee: JTag Technologies B.V., Eindhoven (NL)

( * ) Notice: Subject to any disclaimer, the term of this patent is extended or adjusted under 35 U.S.C. 154(b) by 170 days.

(21) Appl. No.: 13/467,762

(22) Filed: May 9, 2012

(65) Prior Publication Data

US 2012/0290890 A1 Nov. 15, 2012

Related U.S. Application Data

(60) Provisional application No. 61/484,469, filed on May 10, 2011.

(30) Foreign Application Priority Data

May 10, 2011 (NL) ...................................... 2006759

(51) Int. Cl.
*G01R 31/28* (2006.01)
(52) U.S. Cl.
USPC ............ 714/727; 714/726; 714/729; 714/724
(58) Field of Classification Search
None
See application file for complete search history.

(56) References Cited

U.S. PATENT DOCUMENTS

| | | | |
|---|---|---|---|
| 5,202,625 A | 4/1993 | Farwell | |
| 5,471,481 A | 11/1995 | Okumoto et al. | |
| 5,491,666 A | 2/1996 | Sturges | |
| 5,497,378 A | 3/1996 | Amini et al. | |
| 5,510,704 A | 4/1996 | Parker et al. | |
| 5,717,701 A | 2/1998 | Angelotti | |
| 5,757,820 A * | 5/1998 | Angelotti | ....................... 714/738 |
| 5,819,025 A * | 10/1998 | Williams | ......................... 714/30 |
| 6,243,665 B1 | 6/2001 | Nagoya et al. | |
| 6,389,565 B2 | 5/2002 | Ryan et al. | |

(Continued)

FOREIGN PATENT DOCUMENTS

| | | |
|---|---|---|
| EP | 2320241 | 5/2011 |
| WO | 99/39218 | 8/1999 |

OTHER PUBLICATIONS

Dutch Written Opinion issued for Dutch Application No. NL2006759 filed on May 10, 2011, in the name of JTAG Technologies B.V.

(Continued)

*Primary Examiner* — John Trimmings
(74) *Attorney, Agent, or Firm* — Steinfl & Bruno, LLP

(57) ABSTRACT

A method of and an arrangement for determining electric connections at a printed circuit board between boundary-scan compliant circuit terminals of one or more boundary-scan compliant devices. An electronic processing unit retrieves properties of the or each boundary-scan compliant device and a list comprising boundary-scan cells operable as a driver and/or sensor. Based on this list, a boundary-scan cell connected to a circuit terminal is operated as a driver, and at least one other boundary-scan cell connected to another circuit terminal is operated as a sensor. Data from the boundary-scan register, comprising the driver and sensor data, is stored in a storage device. The steps of operating boundary-scan cells as driver and sensor are repeated for a plurality of cells. The data stored are analyzed for determining electric connections. A result of the analysis is presented.

15 Claims, 4 Drawing Sheets

(56) References Cited

U.S. PATENT DOCUMENTS

| | | | |
|---|---|---|---|
| 6,634,005 B1 | 10/2003 | Lindsay et al. | |
| 6,988,229 B1* | 1/2006 | Folea, Jr. | 714/727 |
| 7,409,612 B2 | 8/2008 | Van De Logt et al. | |
| 8,601,333 B2 | 12/2013 | Van Den Eijnden | |
| 2005/0240892 A1 | 10/2005 | Broberg, III et al. | |
| 2008/0218175 A1* | 9/2008 | Chen et al. | 324/538 |
| 2009/0079440 A1* | 3/2009 | Williamson et al. | 324/612 |
| 2011/0204910 A1* | 8/2011 | Suto | 324/754.01 |
| 2013/0214807 A1* | 8/2013 | Okamoto | 324/750.01 |

OTHER PUBLICATIONS

International Search Report issued for Dutch Application No. NL2006759 filed on May 10, 2011, in the name of JTAG Technologies B.V.

Non-Final Office Action mailed on Nov. 21, 2012 for U.S. Appl. No. 12/941,837, filed on Nov. 8, 2010 in the name of Petrus Marinus Cornelis Maria Van Den Eijnden.

Final Office Action mailed on Apr. 10, 2013 for U.S. Appl. No. 12/941,837, filed on Nov. 8, 2010 in the name of Petrus Marinus Cornelis Maria Van Den Eijnden.

Dutch Written Opinion issued for Dutch Application No. NL1037457 filed on Nov. 10, 2009, in the name of JTAG Technologies B.V.

Dutch Search Report issued for Dutch Application No. NL1037457 filed on Nov. 10, 2009, in the name of JTAG Technologies B.V.

Notice of Allowance mailed on Aug. 29, 2013 for U.S. Appl. No. 12/941,837, filed on Nov. 8, 2010 in the name of Petrus Marinus Cornelia Maria Van Den Eijnden.

* cited by examiner

METHOD OF AND AN ARRANGEMENT FOR AUTOMATICALLY MEASURING ELECTRIC CONNECTIONS OF ELECTRONIC CIRCUIT ARRANGEMENTS MOUNTED ON PRINTED CIRCUIT BOARDS

CROSS REFERENCE TO RELATED APPLICATIONS

The present application is related to and claims benefit from U.S. Provisional Patent Application No. 61/484,469 filed on May 10, 2011, entitled "A method of and an arrangement for automatically measuring electric connections of electronic circuit arrangements mounted on printed circuit boards", and Dutch Patent Application NL 2006759 filed on May 10, 2011, both of which are incorporated herein by reference in their entirety.

TECHNICAL FIELD

The present disclosure relates generally to the field of measuring electric connections of electronic circuit arrangements and, more specifically, to automatically determining electric connections at a printed circuit board between circuit terminals of one or more boundary-scan compliant devices of such electronic circuit arrangement, and comparing same with a known or reference electronic circuit arrangement of the same type.

BACKGROUND OF THE DISCLOSURE

Design engineers, service repair technicians, production engineers and the like often require a simple tool for measuring electric connections between circuit terminals or pins of components and devices of an electronic circuit arrangement mounted on a Printed Circuit Board, PCB.

Such connection measurements can be performed using well-known multimeters, for example, by measuring the ohmic resistance between the respective circuit terminals. In the case of a galvanic electric connection by an electrically conductive track on the PCB, for example, the measured resistance will be near zero ohms. In the event of a broken connection, for example, a resistance near infinity will be measured.

The present miniaturization of Integrated Circuits, ICs, and the introduction of Surface Mounted Devices, SMDs, on both sides of a PCB, for example, have made it practically impossible to access the circuit terminals of such devices of an electronic circuit arrangement by the measurement probes of a multimeter or a test bed fixture.

However, also in the design of electronic circuit arrangements mounted on present PCBs there is a genuine need for measuring connections between circuit terminals of circuit components of the electronic circuit arrangement mounted on such PCB, in a simple and reliable manner.

Boundary-Scan Test, BST, technology provides a tool for testing connections between components, such as ICs, of an electronic circuit arrangement mounted on a PCB, without using physical test or measurement probes or fixtures. In a boundary-scan compliant device, boundary scan cells connect between the circuit terminals and the electronic circuitry of the device, also called the In Core Logic. The boundary-scan cells can force and/or capture data, i.e. digital signals, at the circuit terminals of the device. The boundary-scan cells of a device are series connected to form a boundary-scan register. Boundary-scan registers of boundary-scan compliant devices at a PCB may be series connected to form a single boundary-scan chain or a plurality of boundary-scan chains.

Test Access Ports, TAP, are provided for shifting data in and out of the boundary-scan register and for applying control signals to present data at an output of a boundary-scan cell, to capture data at an input of a boundary-scan cell, and for shifting data through the boundary-scan register.

Several types of boundary-scan cells can be distinguished:
an input cell;
an output2 cell, having two possible logic output states 0 or 1;
an output3 cell, having three possible logic output states 0, 1 and Z (tri-state);
a Bi-directional cell or Input/Output cell;
a dot 4 cell;
a dot 6 cell; and
a control cell for enabling or disabling the driver of an output3 cell or a bidirectional cell.

A boundary-scan cell operating for capturing data at an associated circuit terminal is also called a sensor and a boundary-scan cell operating for outputting data at an associated circuit terminal of a boundary-scan compliant device is also called a driver.

Boundary-scan test systems are generally comprised of two basic elements: a Test Program Generator, TPG, and the Test Execution, TE. A TPG requires a list describing the connectivity of the PCB, also called net list, and the so-called Boundary-Scan Description Language, BSDL, files of the respective boundary-scan components mounted on the PCB. BSDL enables users to provide a description of the manner in which a particular device is made boundary-scan compliant. The BSDL file is used by the boundary-scan test system to make use of the device features for test program generation and failure diagnosis.

For performing a boundary-scan measurement to gain knowledge about connections between circuit terminals on a PCB, a user has to provide a test plan consisting of various test steps, including the generation of test vectors, i.e. a well defined series of logical "1" and logical "0" bits. Developing such test vectors is time consuming, requires skilled users and knowledge about how the circuit terminals on the PCB are connected. Since IC's are getting more and more complex, the test procedures become likewise more complex and take more time to be completed. For a user, looking for a simple and reliable automatic alternative to the above-described multimeter approach for measuring connections of an electronic circuit arrangement mounted on a PCB, present regular boundary-scan testing does not provide a genuine alternative.

SUMMARY

In a first aspect, there is provided a method of determining electric connections at a printed circuit board between boundary-scan compliant circuit terminals of at least one boundary-scan compliant device mounted on the printed circuit board and comprising a boundary-scan register of boundary-scan cells connected to the circuit terminals, the method using an electronic processing unit and comprising the steps of:

a) retrieving, by the processing unit, boundary-scan properties of the at least one boundary-scan compliant device, the properties at least comprising a listing of boundary-scan cells operable as a driver and/or sensor;

b) operating, by the processing unit, a boundary-scan cell connected to a circuit terminal as a driver and outputting data at the circuit terminal;

c) operating, by the processing unit, at least one other boundary-scan cell connected to an other circuit terminal as a sensor for sensing data received at the other circuit terminal and latching the sensed data into the boundary-scan register;

d) storing, by the processing unit, in a data storage device data from the boundary-scan register comprising the driver and sensor data;

e) repeating, by the processing unit, steps b)-d) for a plurality of boundary-scan cells of the listing of boundary-scan cells;

f) analyzing, by the processing unit, the stored driver and sensor data for determining electric connections between the circuit terminals on the printed circuit board; and g) presenting, by the processing unit, determined electric connections on the printed circuit board.

The disclosure is based on the insight that circuit terminals of boundary-scan compliant devices of an electronic circuit arrangement mounted on printed circuit board, including a single boundary-scan compliant device, between which a connection has to be tested or measured, are accessible through the corresponding boundary-scan cells connected to these circuit terminals. In the present description and claims such circuit terminals are also called boundary-scan compliant circuit terminals.

A skilled person will appreciate that in the event of an electric connection between circuit terminals, data outputted by one of the circuit terminals operated as a driver is received by an other of the circuit terminals operated as a sensor. In the present description and the claims, the term "electric connection" is construed as comprising a galvanic electric connection, such as an electrically conductive track on a PCB, and/or a logic electric connection, such as provided by a logic inverter or other logic circuit of an electronic circuit arrangement mounted on a PCB logically connecting circuit terminals of the arrangement.

The electronic processing unit operates a boundary scan cell connected to a circuit terminal as a driver and operates at least one other circuit terminal as a sensor. By latching the driver and sensor data in the boundary scan cell register and storing same in a data storage and repeating these steps for a plurality of boundary scan cells connected to circuit terminals of the or each boundary scan compliant device, electric connections between circuit terminals can be determined by matching the stored driver and sensor data. A result is presented holding information about what circuit terminals are connected on the PCB.

In the present description and the claims, the term "operate" or "operating" is to be construed in that the respective boundary-scan cells are controlled to perform the operation of a driver or sensor, respectively. If a respective cell is a permanent driver or output cell, the term operating comprises controlling the respective boundary-scan cell for the purpose of applying data from the boundary-scan register to the circuit terminal associated with the driver or output cell. If a respective cell is a permanent sensor or input cell, the term operating comprises controlling the respective boundary-scan cell for the purpose of latching data from the circuit terminal associated with the sensor or input cell into the boundary-scan register. In case the boundary-scan cells are of the bi-directional type, operating comprises in addition enabling of a cell in the desired mode, i.e. driver or sensor, respectively.

In a basic embodiment of the present method, it suffices to drive the driver at a circuit terminal by a logical "1" and a logical "0" or by a sequence of logical ones and zeros, and to analyze whether the data captured by the at least one sensor at the other circuit terminal(s) follows the order in time of the signals applied by the driver. In the affirmative, one may conclude that the circuit terminals are connected.

Different from regular boundary-scan testing, the present method does not require the generation of complicated test vectors for driving circuit terminals nor a complicated analysis of received and captured data at circuit terminals. It will be appreciated that the output value of boundary-scan compliant circuit terminals not operating as driver or sensor has to be kept unchanged while applying the method according to the disclosure.

The present method can be set up and conducted very quickly. Note that for conducting the present method, no connectivity list or net list of the electronic circuit arrangement and/or the PCB is required, nor is a selection by a user required concerning which circuit terminals have to be measured. The electronic processing unit itself may select, on the basis of the retrieved list of boundary scan properties, which boundary-scan compliant circuit terminals have to be included in the measurement. That is, permanent driver cells may not be operated as sensor and permanent sensor cells may not be operated as driver.

The present method can be conducted fully automatically, without the user having to bother about test vectors. The operation of drivers and sensors may be fully automatically performed by the electronic processing unit itself and may follow an arbitrarily order or a pre-selected measurement sequence, for example.

In an embodiment the step of operating, by the processing unit, at least one other boundary-scan cell as a sensor for sensing data received at the other circuit terminal and latching the sensed data into the boundary-scan register, include simultaneously selecting and operating each boundary-scan cell of the listing of boundary-scan cells operable as a sensor.

That is, for a particular driver selection, all boundary-scan cells connected to a circuit terminal, except for the boundary-scan cell operated as driver, are simultaneously operated as sensor, if applicable from their boundary scan properties. By analyzing the stored data, information can be presented to a user about which circuit terminal or terminals operated as a sensor electrically connect to the circuit terminal operated as a driver.

In an other embodiment, the steps of operating, by the processing unit, a boundary-scan cell connected to a circuit terminal as a driver and outputting data at the circuit terminal; operating, by the processing unit, at least one other boundary-scan cell as a sensor for sensing data received at the other circuit terminal and latching the sensed data into the boundary-scan register; and storing, by the processing unit, data from the boundary-scan register comprising the driver and sensor data in a data storage device, are repeated sequentially for each boundary-scan cell of the listing of boundary-scan cells operable as a driver.

By sequentially operating different circuit terminal as driver and by each time collecting and storing data sensed by the sensors, the processing unit, when all data for each possible driver are collected, may provide the user a complete overview of the electric connections between the circuit terminals of a particular electronic circuit arrangement.

The electronic processing unit of the embodiment holds a data storage or the like for storing, i.e. buffering, the data latched into the boundary-scan register. Depending upon the amount of boundary-scan cells and the size of the boundary-scan register the data storage is arranged for buffering an adequate amount of data. For analyzing purposes, the electronic processing unit may access the data stored in the data storage.

As a first test to get an indication whether boundary-scan compliant circuit terminals are active or alive, the boundary-scan registers of boundary-scan compliant devices may be driven in a so-called sample mode, wherein samples of the logic states or logic signal values at circuit terminals are captured and latched in the boundary scan register, during normal operation of the electronic circuit arrangement under test. By analyzing the samples and if the logic state of a particular circuit terminal does not change at all, this may be a first indication that the respective terminal or terminals is or are not connected, for example.

The boundary-scan properties of a particular boundary-scan compliant device may be retrieved from a library or data bank, such as on-line available from a device manufacturer, for example, either locally or remotely accessible for the electronic processing unit. In particular, a Boundary Scan Description Language, BSDL, file of the or each boundary-scan compliant device mounted at the PCB can be loaded in the processing unit, for displaying the list comprising the boundary-scan compliant circuit terminals, for selecting same and operating a driver and sensor based upon the respective BSDL file.

The BSDL file provides, among others, information about the circuit terminals of a device that are boundary-scan compliant and the types of boundary-scan cells described above, for operating same as a driver or sensor. Further, the BSDL file provides information about the bit position of a respective boundary-scan cell in the boundary-scan register, among others for analyzing purposes. That is, based on the positions of the boundary-scan cells operated as driver and sensor, the driver and sensor data outputted by the boundary-scan register can be compared for the type of connection.

In the case of a plurality of boundary-scan compliant devices mounted on a PCB, prior to the start of a particular measurement, the position of the boundary-scan register of individual boundary-scan compliant devices in a chain of series connected boundary-scan registers of the devices mounted at the PCB has to be known to the processing unit. In a manual embodiment, the processing unit receives this information from user input. From this information and the boundary-scan properties contained in the respective BSDL files, for example, the processing unit can form and shift a proper bit sequence through the chain for operating a selected driver and for analyzing latched data of a selected sensor. In a fully automated version, the processing unit may receive the chain information from a data bank, for example.

In a further embodiment, a graphical user interface device is provided, wherein at least one of the steps of operating, analyzing and presenting are displayed on the graphical user interface device. The different steps and the result of the analysis by the electronic processing unit may be visualized to a user in a number of different manners.

In an example, a listing or table of circuit terminals of the at least one boundary-scan compliant device and electric connections between the circuit terminals determined as a result of the analyzing of the stored driver and sensor data may be presented.

In an other example, a circuit diagram representation may be presented, graphically indicating the at least one boundary-scan compliant device with its circuit terminals and electric connections between the circuit terminals determined as a result of the analysis of the stored driver and sensor data.

In an alternative further embodiment, a manual selection of a plurality of circuit terminals for determining electric connections is provided. To this end the graphical user interface device, in a very easy and intuitive manner, not requiring special skilled knowledge, is controlled by the electronic processing unit such to select a plurality of circuit terminals indicated by a user from a displayed list of boundary-scan compliant circuit terminals. This selection may be displayed by the graphical user interface device before receiving same by the electronic processing unit for further processing of the connections measurement. The graphical user interface device can be even further enhanced in that the activation or operation, i.e. the data outputting by the driver and/or the data sensing by the sensor can be controlled from such graphical user interface device. The user may select particular test data to be applied at the driver through the boundary scan register of a respective boundary-scan compliant device. The analysis result may be presented using the graphical user interface device.

Boundary scan cells of a boundary-scan compliant device not operating as a driver or sensor may be disabled, if applicable, by setting same in a tri-state Z mode, for example, and/or rendered non-operative by use of a BYPASS instruction to the boundary-scan compliant device, bypassing the complete boundary-scan register of a boundary-scan device that not takes part in the connections measurement. The disabling of boundary-scan cells may be controlled from the graphical user interface, for example, or by the electronic processing unit itself from the retrieved properties of the boundary-scan compliant devices. As described above, output3 cells and bidirectional cells may be disabled by a control cell.

For release purposes, for example, one may beforehand identify malfunctioning of the electronic circuit arrangement caused by improper terminal connections by comparing the measurement results of a particular electronic circuit arrangement with identical measurements performed at a known or reference electronic circuit arrangement of the same type. For repair purposes, like measurements can be performed to determine broken or short-circuit connections, for example.

In a further embodiment, also called a compare mode, the determined electric connections at the printed circuit board and electric connections at a reference printed circuit board are compared by the processing unit and a result of the comparison of connections between the printed circuit boards is presented.

In this compare mode, determined electric connections at a PCB of an electronic circuit arrangement under test are compared with known electric connections at a reference PCB of a reference electronic circuit arrangement of the same type as the electronic circuit arrangement under test. In this manner, for example, deviations between the PCB under test and the reference PCB can be indicated, thereby providing an effective tool for fault measurement or release of circuit arrangements.

Those skilled in the art will appreciate that, with the method of the present disclosure, in a so-called learning mode, initially the electric connections at the PCB of a correct operating electronic circuit arrangement can be determined. The thus determined electric connections are then stored and used as reference data for comparing further circuit arrangements and PCBs under test.

In a further aspect, there is provided an arrangement for determining electric connections at a printed circuit board between boundary-scan compliant circuit terminals of at least one boundary-scan compliant device mounted on the printed circuit board and comprising a boundary-scan register of boundary-scan cells connected to the circuit terminals, the arrangement comprising an electronic processing unit, wherein the electronic processing unit is arranged for:
    retrieving boundary-scan properties of the at least one boundary-scan compliant device, the properties at least comprising a listing of boundary-scan cells operable as a driver and/or sensor;

operating a boundary-scan cell connected to a circuit terminal as a driver and outputting data at the circuit terminal;

operating the at least one other boundary-scan cell connected to an other circuit terminal as a sensor for sensing data received at the other circuit terminal and latching the sensed data into a boundary-scan register;

storing, in a data storage device, data from the boundary-scan register comprising the driver and sensor data;

repeating the operating and outputting, operating and latching and storing for a plurality of boundary-scan cells of the listing of boundary-scan cells;

analyzing the stored driver and sensor data for determining electric connections between the circuit terminals at the printed circuit board; and presenting determined electric connections between circuit terminals at the printed circuit board.

As described above, the electronic processing unit may automatically operate boundary-scan cells as driver and/or sensor, either randomly or in accordance with a particular selection scheme.

In a further embodiment the present arrangement comprises a graphical user interface device operatively connected to the electronic processing unit at least arranged for presenting the result of at least one of the steps of retrieving boundary-scan properties of the at least one boundary-scan compliant device, operating a boundary-scan cell as a driver, operating at least one other boundary-scan cell as sensor and analyzing and presenting a result of the driver and sensor data.

The arrangement further comprises input means for inputting boundary scan properties of boundary scan compliant devices, such as BSDL files, and for inputting user data such as control signals, a particular plurality of circuit terminals for determining electric connections, and the like.

The present method may be executed by an electronic processing device through a control interface for controlling the boundary-scan logic. Such control interfaces are known and commercially available from applicant.

The arrangement, in an embodiment, further comprises a control interface, electronically connected to the electronic processing device for controlling the boundary-scan logic and the data storage device for storing, i.e. buffering, data of the boundary scan register.

In another aspect, the disclosure also provides a computer program product comprising a computer program having program code data stored on a data carrier and arranged for performing the present method, when the program code data are loaded into a memory of an electronic processing unit or device and are executed by the electronic processing unit.

Advantageously, this computer program product may be comprised by any of a group of data carrying devices including floppy discs, CD-ROMs, DVDs, tapes, memory stick devices, zip drives, flash memory cards, remote access devices, hard disks, semi-conductor memory devices, programmable semi-conductor memory devices, optical disks, magneto-optical data storage devices, ferro electric data storage devices and electrical and optical signal carriers or any other type of data carrier, having the program code data stored thereon.

The above-mentioned and other features and advantages of the disclosure are illustrated in the following description with reference to the enclosed drawings which are provided by way of illustration only and which are not limitative to the present disclosure.

DETAILED DESCRIPTION

Figure 1:
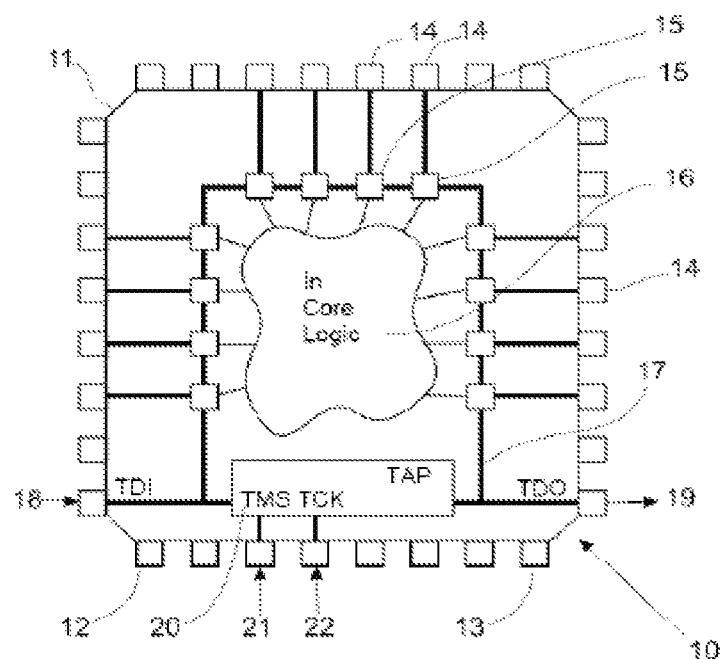
FIG. 1 shows, in a schematic and illustrative manner, a typical prior art boundary-scan compliant electronic device.

FIG. 1 shows an embodiment of a boundary-scan compliant device 10 comprising a housing 11 provided with supply terminals 12, 13 for powering electronic circuitry or In Core Logic 16. The housing 11 comprises a plurality of circuit terminals 14, also called boundary-scan compliant circuit terminals, connected via boundary-scan cells 15 to the In Core Logic 16. In this embodiment the housing 11 is of a typical Surface-Mounted Device, SMD type. The boundary-scan cells 15 together form a boundary-scan register 17 in which data is shifted from a Test Data Input, TDI 18, via the different boundary-scan cells 15, to a Test Data Output, TDO 19. The different boundary-scan parts are controlled by a Test Access Port controller, TAP 20, having at least a Test Mode Select Input, TMS 21, and a Test Clock Input, TCK 22. The TAP controller 20 is controlled in a way well-known to those skilled in the art and defined by boundary-scan standards, such as IEEE STD 1149.1 and higher.

Figure 2:
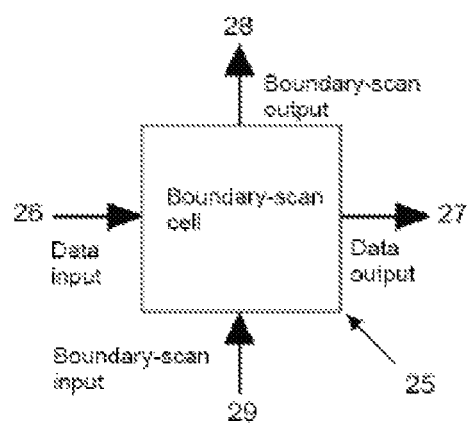
FIG. 2 shows, in a schematic and illustrative manner, a typical prior art boundary-scan cell.

FIG. 2 schematically shows a generalized representation of a boundary-scan cell, BSC, 25, having an input 26 and an output 27. The boundary-scan cell 25 may operate as a sensor for sensing and capturing logic signals at a circuit terminal of the boundary-scan compliant device. To this end the input 26 is connected to a circuit terminal 14, as shown in FIG. 1. The output of the boundary-scan cell 27 then connects to the In Core Logic 16. The boundary-scan cell 25 may also operate as a driver for outputting a logic signal at a circuit terminal of the boundary-scan compliant device. To this end the input 26 is connected to the In Core Logic 16 and the output 27 is connected to a circuit terminal 14.

The boundary-scan cell 25 can either be a permanent driver, a permanent sensor or of a bi-directional type. When being bi-directional, the mode of the boundary-scan cell 25 (i.e. driver or sensor) is controlled from the TAP controller 20 by a boundary-scan cell operating as a control cell (not shown). Capturing data at the input and forcing data at the output of the cell 25 are also controlled from the TAP controller 20, in a standardized manner, as known to the skilled person. Output 28 and input 29 of the boundary-scan cell 25 are register connections for connecting to a corresponding neighbouring boundary-scan cell input 29 and output 28, respectively. Boundary-scan cells series connected in this way form the boundary-scan shift register 17, as shown in FIG. 1.

Figure 3:
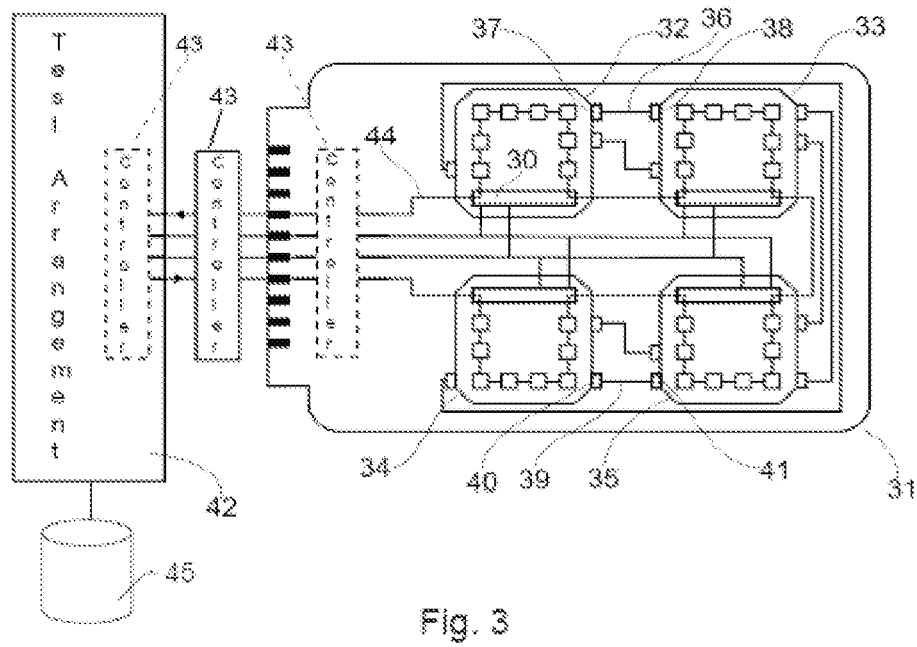
FIG. 3 shows, in a schematic and illustrative manner, an electronic circuit arrangement mounted on a printed circuit board as a device under test connected to a test arrangement for performing a connections measurement according to the present disclosure.

FIG. 3 shows an example of a Printed Circuit Board, PCB, 31 with four boundary-scan compliant devices 32, 33, 34, 35 constituting an electronic circuit arrangement. The boundary-scan registers of the devices 32, 33, 34, 35 are series connected and form a boundary-scan chain 44, controlled from a control interface or boundary scan controller 43. The controller 43 is, in general, a control interface device separate from the PCB 31. However, as illustratively shown in broken lines, the controller 43 may also be mounted at the PCB 31. The controller 43 operates the TAP controllers 30 of the boundary-scan compliant devices 32, 33, 34, 35.

FIG. 3 shows several electric connections at the PCB 31, such as the electric connections 36, 39 between different boundary-scan compliant circuit terminals 37, 38 and 40, 41, respectively. Such electric connections, in general, are formed by electric conductive tracks at the PCB. Although not illustrated, the PCB 31 may also comprise electric connections between boundary-scan compliant circuit terminals of one and the same boundary-scan compliant device 32, 33, 34, 35. Those skilled in the art will appreciate that in practice a PCB 31 comprises a plurality of connections 36, 39 either direct or galvanic connections and/or logical connections.

Assume a user would like to test connection 36, connecting boundary-scan compliant circuit terminal 37 of the boundary-scan compliant device 32 and boundary-scan compliant circuit terminal 38 of the boundary-scan compliant device 33, as well as connection 39, connecting boundary-scan compliant circuit terminal 40 of the boundary-scan compliant device 34 and boundary-scan compliant circuit terminal 41 of boundary-scan compliant device 35. Note that the connections 36 and 39 need not be known beforehand.

Using prior art boundary-scan test methods and equipment, for testing the connections 36, 39 a complex set of test vectors has to be developed, executed and analyzed.

As will be illustrated in detail with reference to FIG. 4, with a test or measurement arrangement 42 according to the present disclosure, the connections 36, 39 can be tested in an intuitive and easy-to-use manner. The arrangement 42, comprising an electronic processing unit or device, operates in conjunction with the controller 43, using standardized boundary-scan control instructions. For the purpose of the present disclosure these control instructions are regarded as known to the person skilled in the art of boundary-scan and are not repeated here.

It will be appreciated that the boundary scan controller 43 may also be incorporated in the test arrangement 42, or on the PCB 31, as illustratively shown by broken lines.

Figure 4:
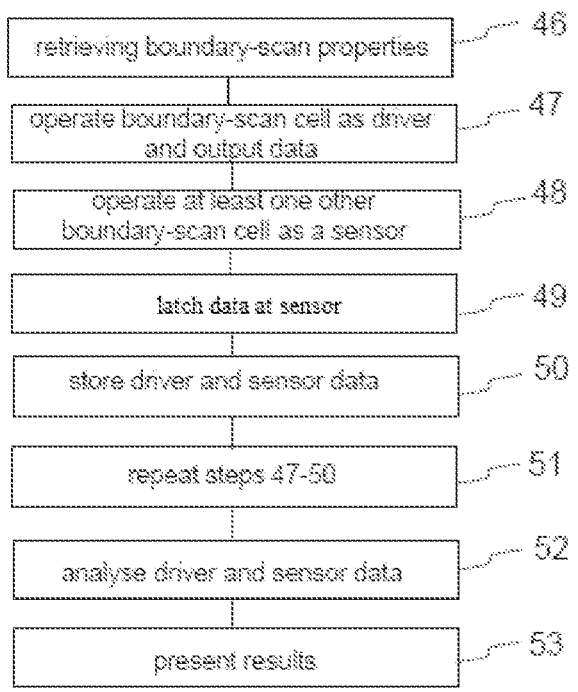
FIG. 4 shows, in a schematic and illustrative manner, a flow chart diagram illustrating the steps of an embodiment of the method in accordance with the disclosure.

FIG. 4 shows steps of an example embodiment for determining electric connections on the PCB 31 as shown in FIG. 3 by the test arrangement 42 in accordance with an example of the present disclosure. For determining connections such as 36 and 39, in a first step 46, "Retrieving boundary-scan properties", boundary-scan properties of the or each boundary-scan compliant device 32, 33, 34, 35 mounted at the PCB 31 are retrieved by the electronic processing unit of the test arrangement 42. The properties at least comprise a listing of boundary-scan compliant circuit terminals of the boundary-scan compliant device(s) 32, 33, 34, 35. The properties further comprise information regarding the type of boundary-scan cells connected to the boundary-scan compliant circuit terminals of the boundary-scan compliant device(s) 32, 33, 34, 35. With this type information of the boundary-scan cells the test arrangement 42 can at least determine whether a boundary-scan cell is operable as a driver, operable as a sensor or as both, i.e. bi-directional.

The respective properties can be retrieved automatically by the processing unit of the arrangement 42, based on prior knowledge of a particular PCB 31, i.e. the type or types of boundary-scan compliant devices 32, 33, 34, 35 mounted thereon, or from a manual user input of the several types of boundary-scan compliant devices 32, 33, 34, 35 mounted at the PCB 31. Having the type information of the devices, their respective boundary scan properties can be retrieved from a library or data bank, such as on-line available from a device manufacturer, for example, either locally or remotely accessible for the electronic processing unit of the arrangement 42. In particular, a Boundary Scan Description Language, BSDL, file of the or each boundary-scan compliant device mounted at the PCB can be loaded in the processing unit.

For shifting a suitable bit sequence through the boundary scan registers of the boundary-scan compliant devices 32, 33, 34, 35, the processing unit of the test arrangement 42 has to know the position of the several devices 32, 33, 34, 35 in the chain of series connected boundary-scan registers. Likewise, for analyzing purposes, the processing unit must know the position of latched data of a selected sensor in the chain of series connected boundary-scan registers. This information may be provided manually by a user having knowledge of the PCB 31 or the information may be electronically available from a data bank comprising such information of a particular PCB or electronic circuit arrangement, for example.

In a second step 47, "Operate boundary-scan cell as driver and output data", a boundary-scan cell of the list of boundary-scan cells formed by the step 46 of retrieving boundary-scan properties, is operated as a driver such that data is outputted at the circuit terminal connected to the selected boundary-scan cell. The test arrangement 42 itself automatically selects a boundary-scan cell to be operated as a driver based on a random pick from the list of boundary-scan cells or, for example, based on the first boundary-scan cell of the list operable as a driver, or any other predetermined sequence.

In an alternative embodiment, a user of the test arrangement 42 may decide which circuit terminal should be tested so which therewith connected boundary-scan cell is to be operated as a driver, presuming the boundary-scan cell is operable as a driver and not, for example solely as a sensor.

For outputting data, the driver is controlled for providing a logical signal, such as a logical "1", a logical "0" or combinations of logical one's and zero's at its connected circuit terminal, such as terminal 37. The data for outputting by the driver are supplied to the respective boundary-scan cell operated as driver via the boundary-scan register under control of the boundary-scan controller 43, the TAP control logic of a particular device and the electronic processing unit of the test arrangement 42.

In step 48, "Operate at least one other boundary-scan cell as sensor", boundary-scan cell(s) which are operable as sensor are operated as sensor(s) by the processing unit of the test arrangement 42 for collecting data in response to the data outputted by the driver. At least a single boundary-scan cell is to be operated as a sensor, which for example in FIG. 3 could be the boundary-scan cell connected to the circuit terminal 38, assuming this boundary-scan cell is of a type operable as a sensor.

In a further embodiment a plurality of boundary-scan cells are operated as sensor and in another embodiment all boundary-scan cells of the boundary-scan compliant devices 32, 33, 34, 35 of the PCB 31 operable as a sensor are simultaneously operated as a sensor.

The term "operate" is to be construed in that the respective boundary-scan cells are controlled to perform the operation of an output or input cell, respectively a driver or sensor. If a respective cell is a permanent output cell, then the operating step 47 comprises selecting and controlling of the respective boundary-scan cell for the purpose of applying data from the boundary-scan register to the circuit terminal associated with the output cell. If a respective cell is a permanent input cell, then the operating step 49 comprises selecting and controlling the respective boundary-scan cell for the purpose of latching data from the circuit terminal associated with the input cell into the boundary-scan register. In case the boundary-scan cells are of the bi-directional type, the operating steps 46 and 48 in addition comprise enabling of a cell in the desired mode, i.e. driver or sensor, respectively.

At the next step 49, "Latch data at sensor", data sensed by one or more sensor(s) at one or more circuit terminal(s) connected therewith are latched in the boundary-scan register at the position determined by the selected sensor boundary-scan cell, under control of the boundary-scan controller 43 and the electronic processing unit of the test arrangement 42.

Further, in step 50, "Store driver and sensor data", the data comprising the sensor and driver data obtained from the boundary-scan register 44 are stored in a data storage device 45. The data storage device 45 may be integrated in the boundary-scan controller 43 or the test arrangement 42 itself or both. In FIG. 3 the data storage device 45 is indicated as a separate device accessible by the test arrangement 42. By storing data from the boundary-scan register 44, all data regarding the circuit terminals responding to the circuit terminal connected with the boundary-scan cell operated as a driver, i.e. the driver and sensor data, are stored for further processing by the test arrangement 42.

For completely determining the electric connections on the PCB 31, in accordance with the disclosure, steps 47, 48, 49 and 50 are repeated by the test arrangement 42, i.e. the processing unit thereof, for a plurality of boundary-scan cells of the listing of boundary-scan cells. This as indicated by step 51, "repeat steps 47-50".

For example, in an embodiment of the method according to the disclosure, a series of measurements or tests can be applied automatically on the electronic circuit arrangement at the PCB 31 by the test arrangement 42. The series of tests may comprise a batch of all boundary-scan cells operable as a driver to be operated as a driver subsequently. For each boundary-scan cell operated as a driver all data of responding boundary-scan cells operable as a sensor are simultaneously latched into the data storage. The test arrangement 42 then, after or during the measurements, analyses the data forming a total result of all driver and sensor data, holding information about all connections on the PCB 31 of the boundary-scan compliant devices.

In step 52, "Analyze driver and sensor data", at least the captured data retrieved from the boundary scan-register are analyzed by the processing unit of the test arrangement 42, for connections between driver(s) and sensor(s). The analyzing of the data may be a logical comparison of both driver and sensor data, i.e. at least a logic high value 1 and a logic low value 0. If both data are equal, one may validly conclude that both circuit terminals 37, 38 are connected, either by a direct or galvanic connection 36 or theoretically also by a non-inverting logic connection. If the driver data and the sensor data are inverted, one may conclude that the connection 36 is an inverting connection. If the driver and sensor data are not equal, for example no corresponding data are latched from the sensor, the connection 36 is in error or absent, for example.

As an advantage over a multimeter measurement, the present method is able to measure both a galvanic electric connection and a logic electric connection formed by logic circuits of the electronic circuit arrangement mounted on the PCB.

For analyzing the data latched by a sensor, each time a driver output signal, i.e. a logic "1" or a logic "0" signal, is provided the boundary-scan register or the boundary-scan chain 44 may be completely read and analyzed.

Note that operating a cell as driver via the TAP controller of a boundary-scan compliant device may result in operating other cells as driver too. Likewise, operating a selected cell as sensor may result in latching data at other cells operating as sensor. In such a case, the processing unit is arranged to shift a sequence of data bits through the chain of boundary-scan registers such that only the output of the boundary-scan cell operated as a driver changes its value, from logic 0 to logic 1 or the other way around, for example. By knowing the bit position of a sensor or the sensors, the processing unit can select the values latched by the respective sensor or sensors.

Those skilled in the art will appreciate that the bits shifted through the chain of boundary-scan registers may be selected such to keep other non-boundary-scan compliant devices or components mounted at the PCB and in connection with circuit terminals of a particular boundary-scan compliant device, such as buffers or the like, in a safe mode of operation, for example disabled. This to avoid driver conflicts while operating the selected driver or drivers by the processing unit.

Alternatively, to test connections between boundary-scan compliant circuit terminals that connect by a so-called active transparent electrical component or device, such as a buffer or the like, of which the output signal equals the input signal, i.e. there is no alteration of the data by the transparent component or device, the bits shifted through the chain of boundary-scan registers may be selected and set by the processing unit to enable such transparent device. That is, to provide that the driver data of the selected driver is transported or shifted through the transparent device towards a sensor.

In a further embodiment, use can be made of a so-called dot 6 boundary-scan cell as driver, operating in a so-called toggle mode, in which a pulse or a pulse train of logical signals is outputted once the driver is triggered by a logic signal in the boundary-scan register of which the respective driver forms part of. By a so-called dot 6 receiver cell, a rising and/or falling signal edge of a respective pulse can be detected, thereby providing the possibility of measuring capacitive connections formed by a capacitor that intentionally connects selected circuit terminals or unintentionally by a defect at the PCB. The series of logic 1 and logic 0 signals outputted in the toggle mode can be set. If the set driver output data are known, the latched sensor data can be analyzed for a connection based on this known driver data. A dot 6 receiver as sensor may operate with a dot 1 driver, for example.

In step 53, "Present result", the results of the analysis are presented by the arrangement 42, showing what connections are present from a specific circuit terminal used in the test, i.e. by operating its therewith connected boundary-scan compliant circuit terminal as a driver, or, in a further embodiment even showing all connections present on the PCB 31. The above test may be fully automated executed by the test arrangement 42, because for a simple connections test in principal no special test vector has to be generated. Such a fully automated, without input from the user, applied test by the test arrangement 42, can present the result of all connections of the PCB 31 determined by the test arrangement 42. The user only has to decide at what time the test arrangement should start the test and the fully automated test is executed, then, without further input from the user, the results of the test are presented to him/her.

Figure 5:
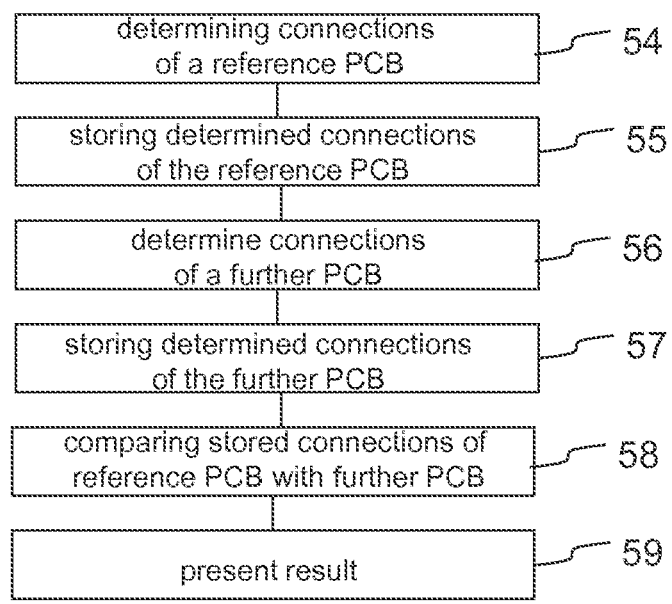
FIG. 5 shows, in a schematic and illustrative manner, a flow chart diagram illustrating the steps of a further embodiment of the method in accordance with the disclosure.

FIG. 5 shows steps of an example embodiment of so-called learning and comparing modes, for comparing PCBs. For this, the method according to this example embodiment uses an electronic processing unit in a test arrangement similar to, or the same as, the test arrangement 42 shown in FIG. 3. The method compares connections of individual PCBs by applying the steps of determining connections according to the previously disclosed example embodiment, explained by the steps 46 to 53 of FIG. 4. These steps 46-53 are in step 54 of FIG. 5, "determining connections of a reference PCB" applied to a PCB which is selected by a user to function as a reference PCB comprising an electronic circuit arrangement of a type similar to an electronic circuit at the PCB to be tested.

The results as presented in step 53 of the embodiment disclosed by FIG. 4 are stored in step 55 of FIG. 5, "storing determined connections of the reference PCB". These results can be stored in a data storage device, such as the data storage device 45, for example, especially preserved for applying this step of the method or a data storage already present in the test arrangement. The stored results comprise information about what electric connections are present at the reference PCB and are actually functional.

In the example embodiment as shown by FIG. 5, in the learning mode, a user selects which PCB is to be used as the reference PCB, i.e. a PCB and electronic circuit arrangement of which he/she knows is fully operational, in other words, fault-free. In step 56, "determine connections of a further PCB", in the comparing mode, a further PCB is tested according to the steps 46-53 disclosed in FIG. 4. The results of this test comprises information about what connections are present on this further PCB. These determined connections, i.e. the outcome of step 53 of FIG. 4, are then in step 57, "storing determined connections of further PCB" stored in the data storage according to step 55.

The processing unit of the test arrangement then, in step 58, "comparing stored connections of reference PCB with further PCB", compares the results of the further PCB obtained in step 56 with the results of the reference PCB obtained in step 54. During this step the test arrangement can provide the user of the test arrangement with a signal indicative for a correct or an incorrect operation of the further PCB. For example the test arrangement can comprise a visual or auditive indication for the user when the tested further PCB's connections between the circuit terminals do not match the connections of the reference PCB's connections between the circuit terminals. This is an indication for a PCB having faulty connections. This result is, in step 59, "presenting result" presented to the user.

The method described with reference to FIG. 5 may form part of an acceptance or release test of an electronic circuit arrangement or may be performed as a step in a repair process of an electronic circuit arrangement, for example.

Figure 6:
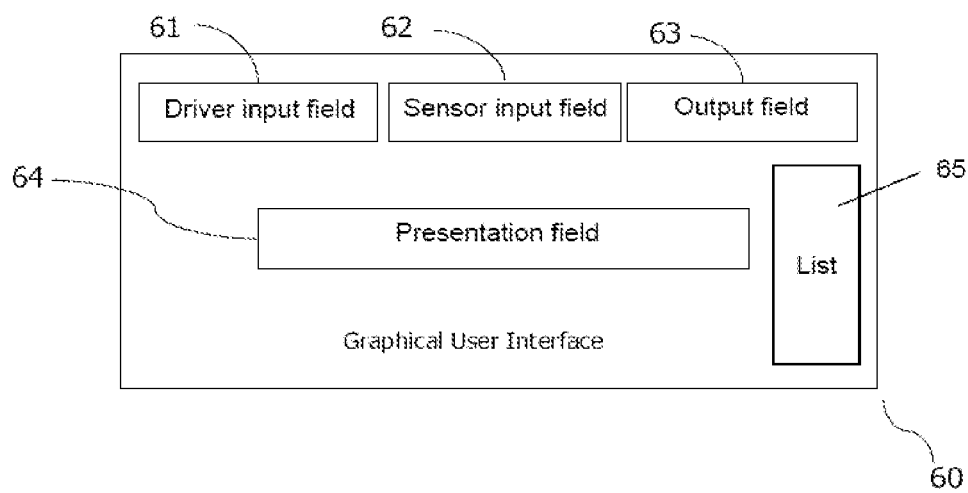
FIG. 6 shows, in a very schematic and illustrative manner, a graphical user interface for use with the present disclosure.

In FIG. 6 a Graphical User Interface, GUI, device 60, of the arrangement 42, for example a computer display, is shown. The GUI 60 comprises a first input field 61, indicating from a list 65 comprising boundary-scan compliant circuit terminals of the boundary-scan compliant devices a circuit terminal of a boundary-scan compliant device operated as a driver, and a second input field 62 for operating one or more circuit terminal(s) of a boundary-scan compliant device as a sensor. If required, in a manual operation, data to be outputted by the driver can be set at field 63.

The result of the measurements or test is shown within the presentation field 64 and/or acoustically signaled. The result may be displayed in the form of circuit diagram representation and/or a list or table of connected circuit terminals and comprises information about a connection, more connections or all connections of a single PCB. The result may, when operative in an example embodiment as shown by the steps 54-59 of FIG. 5, further display whether the connections of the tested PCB are equal to the reference PCB or where they differ.

All selecting and execution of a test or measurement can be done by use of an input device, such as keyboard or mouse operatively connected to the arrangement 42, comprising a digital processing unit, as generally known to the person skilled in the art.

Boundary scan cells not operating as a driver or sensor may be disabled, if applicable, and if possible without affecting a selected driver or sensor, by setting same in tri-state Z mode, or made non-operative by use of a suitable instruction to the TAP controller of the boundary-scan compliant devices, bypassing the complete boundary-scan register of a boundary-scan device that not takes part in the connections measurement. The disabling of boundary-scan cells may be controlled from the graphical user interface, controlling the TAP controller of the device, for example. As described above, output3 cells and bidirectional cells may be disabled by a control cell.

In particular, information regarding the boundary-scan properties of boundary-scan compliant devices can be retrieved from the Boundary Scan Description Language, BSDL, file of a boundary-scan compliant device mounted at the PCB. The information of the BSDL files is also used for the GUI 60, to visualize the several fields, as discussed.

The disclosure can be performed by a suitable programmed electronic processing unit taking the form of an electronic computer device and a computer program product comprising a computer program in the form of code data stored on a data carrier and arranged for performing the method disclosed, if loaded into a working memory of the electronic processing device.

The computer program product may comprise, but is not limited to, any of a group of data devices including floppy discs, CD-ROMS, DVDs, tapes, memory stick devices, zip drives, flash memory cards, remote access devices, hard disks, semi-conductor memory devices, programmable semi-conductor memory devices, optical disks, magneto-optical data storage devices, ferro electric data storage devices, optical signal, electric signal and magnetic carriers and the like.

Figure 7:
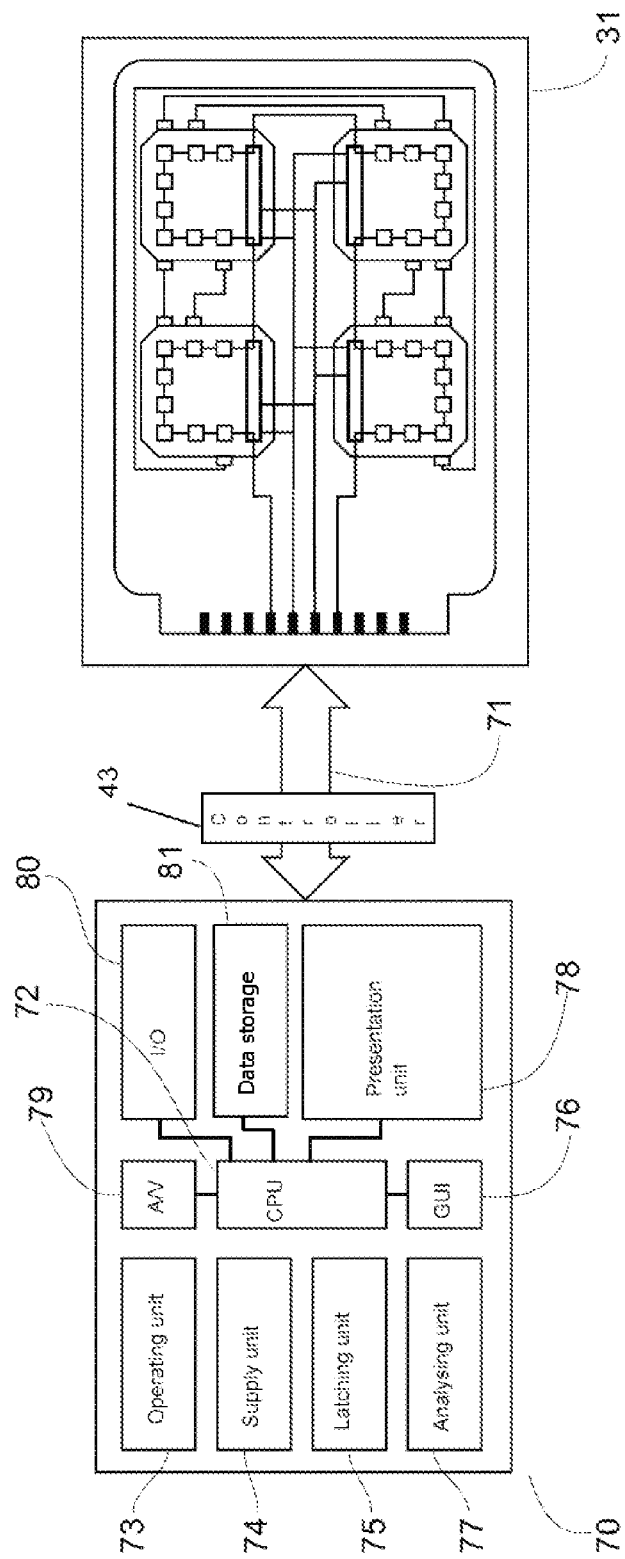
FIG. 7 shows, in a schematic and illustrative manner, an embodiment of a test arrangement for performing a connections measurement according to the present disclosure, connected to a printed circuit board.

FIG. 7 shows the PCB 31 connected, for example, by a bus 71 to an arrangement 70 according to the disclosure. The arrangement 70 comprises an electronic Central Processing Unit, CPU, 72 like a computer or micro-processor or the like, operatively connected to an operating unit 73 for operating a boundary-scan cell connected to a circuit terminal of a boundary-scan compliant device as a driver and for selecting and operating at least one other boundary-scan cell connected to an other circuit terminal of a boundary-scan compliant device as a sensor. A supply unit 74 for supplying data to the boundary-scan cell operating as the driver. A latching unit 75 for latching data sensed by the at least one sensor. An analyzing unit 77 for analyzing the driver and sensor data for a electric connection between the circuit terminals, and a presentation unit 78 for presenting a result of the analyzing of the driver and sensor data. The arrangement further comprises a data storage device 81, for storing the data comprising the driver and sensor data from the boundary-scan register.

The arrangement 70 further comprises an acoustic signaling unit or audio/visual signaling unit 79, an Input/Output unit 80, among others for loading BSDL files, and Graphical User Interface, GUI, device 76, for presenting measurement or test results and selecting drivers and sensors, in accordance with the embodiments described above.

Based on the above description, a skilled person may provide modifications and additions to the method and arrangement disclosed, which modifications and additions are all comprised by the scope of the appended claims.

The invention claimed is:

1. A method of determining electric connections at a printed circuit board between boundary-scan compliant circuit terminals of at least one boundary-scan compliant device mounted on said printed circuit board and comprising a boundary-scan register of boundary-scan cells connected to said circuit terminals, said method using an electronic processing unit and comprising the steps of:
   a) retrieving, by said processing unit, boundary-scan properties of said at least one boundary-scan compliant device, said properties at least comprising a listing of boundary-scan cells operable as a driver and/or sensor;
   b) operating, by said processing unit, a boundary-scan cell connected to a circuit terminal as a driver and outputting data at said circuit terminal;
   c) operating, by said processing unit, at least one other boundary-scan cell connected to an other circuit terminal as a sensor for sensing data received at said other circuit terminal and latching said sensed data into said boundary-scan register;
   d) storing, by said processing unit, in a data storage device data from said boundary-scan register comprising said driver and sensor data;
   e) repeating, by said processing unit, steps b)-d) for a plurality of boundary-scan cells of said listing of boundary-scan cells;
   f) analyzing, by said processing unit, said stored driver and sensor data for determining electric connections between said circuit terminals on said printed circuit board; and
   g) presenting, by said processing unit, determined electric connections at said printed circuit board.

2. The method of claim 1, wherein said step of operating, by said processing unit, at least one other boundary-scan cell connected to an other circuit terminal as a sensor for sensing data received at said other circuit terminal and latching said sensed data into said boundary-scan register includes simultaneously operating each boundary-scan cell of said listing of boundary-scan cells operable as a sensor.

3. The method of claim 1, wherein said step of repeating comprises repeating steps b)-d) sequentially for each boundary-scan cell of said listing of boundary-scan cells operable as a driver.

4. The method of claim 1, wherein said boundary-scan properties are retrieved from a Boundary Scan Description Language, BSDL, file of said at least one boundary-scan compliant device.

5. The method of claim 1, further comprising a graphical user interface device, wherein at least one of said steps of operating, analyzing and presenting are displayed on said graphical user interface device.

6. The method of claim 1, wherein said step of presenting comprises providing a list of circuit terminals of said at least one boundary-scan compliant device and electric connections between said circuit terminals determined as a result of said analyzing of said stored driver and sensor data.

7. The method of claim 1, wherein said step of presenting comprises providing a circuit diagram representation graphically indicating circuit terminals of said at least one boundary-scan compliant device and electric connections between said circuit terminals determined as a result of said analyzing of said stored driver and sensor data.

8. The method of claim 1, wherein boundary-scan cells of at least one boundary-scan compliant device not operated as driver or sensor are disabled separately and/or by use of a BYPASS instruction of said boundary-scan compliant devices.

9. The method of claim 1, further comprising comparing, by said processing unit, said determined electric connections at said printed circuit board and electric connections at a reference printed circuit board and presenting, by said processing unit, a result of said comparison of connections between said printed circuit boards.

10. An arrangement for determining electric connections at a printed circuit board between boundary-scan compliant circuit terminals of at least one boundary-scan compliant device mounted on said printed circuit board and comprising a boundary-scan register of boundary-scan cells connected to said circuit terminals, said arrangement comprising an electronic processing unit, wherein said electronic processing unit is arranged for:
   retrieving boundary-scan properties of said at least one boundary-scan compliant device, said properties at least comprising a listing of boundary-scan cells operable as a driver and/or sensor;
   operating a boundary-scan cell connected to a circuit terminal as a driver and outputting data at said circuit terminal;
   operating at least one other boundary-scan cell connected to an other circuit terminal as a sensor for sensing data received at said other circuit terminal and latching said sensed data into a boundary-scan register;
   storing, in a data storage device, data from said boundary-scan register comprising said driver and sensor data;
   repeating said operating and outputting, operating and latching and storing for a plurality of boundary-scan cells of said listing of boundary-scan cells;
   analyzing said stored driver and sensor data for determining electric connections between said circuit terminals at said printed circuit board; and
   presenting determined electric connections between circuit terminals at said printed circuit board.

11. The arrangement of claim 10, comprising a data storage device operatively connected to said electronic processing unit.

12. The arrangement of claim 10, further comprising a graphical user interface device operatively connected to said electronic processing unit.

13. The arrangement of claim 10, further comprising input means for inputting boundary scan properties of boundary scan compliant devices, such as BSDL files, and for inputting user data.

14. The arrangement of claim 10, wherein said electronic processing unit is arranged for comparing said determined electric connections at said printed circuit board and electric connections at a reference printed circuit board and for presenting a result of said comparison of electric connections between said printed circuit boards.

15. A computer program product comprising a non-transitory data storage device storing computer program code data arranged for performing the method of claim 1, when said program code data are loaded into a memory of an electronic processing unit and are executed by said electronic processing unit.

* * * * *